United States Patent
Danjo

(10) Patent No.: US 8,384,571 B2
(45) Date of Patent: Feb. 26, 2013

(54) A/D CONVERSION CIRCUIT AND A/D CONVERSION METHOD

(75) Inventor: Takumi Danjo, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 77 days.

(21) Appl. No.: 13/159,210

(22) Filed: Jun. 13, 2011

(65) Prior Publication Data

US 2011/0309961 A1    Dec. 22, 2011

(30) Foreign Application Priority Data

Jun. 18, 2010 (JP) .................................. 2010-139064

(51) Int. Cl.
H03M 1/06 (2006.01)

(52) U.S. Cl. ........................................ 341/118; 341/120

(58) Field of Classification Search .................. 341/155, 341/120, 118, 159, 160, 156

See application file for complete search history.

(56) References Cited

U.S. PATENT DOCUMENTS

| 6,856,265 B2 * | 2/2005 | Kuo et al. ...................... 341/118 |
| 7,433,795 B2 * | 10/2008 | Chung et al. ................... 702/147 |
| 7,855,667 B2 * | 12/2010 | Tsukamoto ..................... 341/120 |
| 8,089,388 B2 * | 1/2012 | Cui et al. ....................... 341/158 |

OTHER PUBLICATIONS

Hosotani, Shiro et al., "An 8-bit 20 MS/s CMOS A/D Converter with 50 mW Power Consumption", Feb. 1, 1990.
Sushihara, Koji et al., "A 7b 450MSample/s 50mW CMOS ADC in 0.3mm$^2$", Jan. 1, 2002.

* cited by examiner

Primary Examiner — Peguy Jean Pierre
(74) Attorney, Agent, or Firm — Fujitsu Patent Center

(57) ABSTRACT

An analog-to-digital conversion circuit includes: comparators to compare an input analog signal and one of reference voltages corresponding to each operation in an analog-to-digital conversion; an interpolating comparator to compare the input analog signal and a determination voltage between first and second reference voltages corresponding to two comparators; a correction value acquisition circuit to calculate a correction value to correct an error between the input analog signal and the determination voltage; a correction value application circuit to set the correction value in the interpolating comparator; a test voltage generation circuit to supply the two comparators with a first test voltage corresponding to one of the determination voltages; a common voltage generation circuit to supply the two comparators with a second test voltage; and a correction value calculation circuit to calculate respective correction values corresponding to the determination voltages based on errors corresponding to the first and second test voltages.

11 Claims, 13 Drawing Sheets

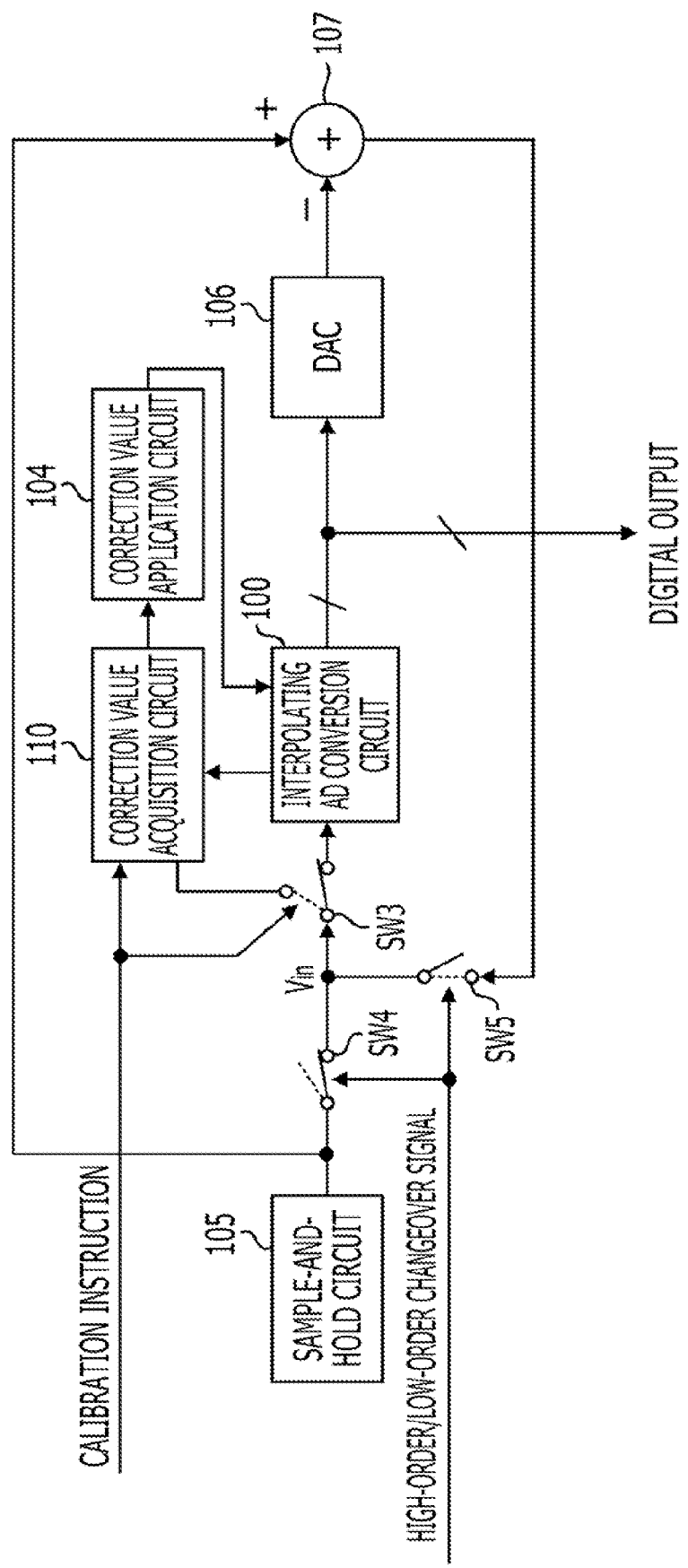

| LATCH ID | CHANNEL WIDTH RATIO |
|---|---|
| $L_i$ | 0:n |
| $L_{i,1}$ | 1:n-1 |
| $L_{i,2}$ | 2:n-1 |
| ... | ... |
| $L_{i,n-1}$ | n-1:1 |
| $L_{i+1}$ | n:0 |

FIG. 9

| MATCH DETERMINATION VOLTAGE | LATCH ID | HIGH-ORDER CONVERSION CORRECTION VALUE | LOW-ORDER CONVERSION CORRECTION VALUE | CHARACTERISTIC CORRECTION VALUE |
|---|---|---|---|---|
| ... | ... | ... | ... | ... |
| REFERENCE VOLTAGE $V_i$ | $L_{(i)}$ | — | — | $calcm_i$ |
| INTERMEDIATE VOLTAGE | $L_{(i,1)}$ | $CAL_{i(1)}$ | $cal_{i(1)}$ | $calcm_{i(1)}$ |
| | $L_{(i,2)}$ | $CAL_{i(2)}$ | $cal_{i(2)}$ | ... |
| | ... | ... | ... | ... |
| | $L_{(i,n-1)}$ | $CAL_{i(n-1)}$ | $cal_{i(n-1)}$ | $calcm_{i(n-1)}$ |
| REFERENCE VOLTAGE $V_{i+1}$ | $L_{(i+1)}$ | — | — | $calcm_{i+1}$ |
| INTERMEDIATE VOLTAGE | $L_{(i+1,1)}$ | $CAL_{i+1(1)}$ | $cal_{i+1(1)}$ | $calcm_{i+1(1)}$ |
| ... | ... | ... | ... | ... |

A/D CONVERSION CIRCUIT AND A/D CONVERSION METHOD

CROSS-REFERENCE TO RELATED APPLICATIONS

This application claims the benefit of priority from Japanese Patent Application No. 2010-139064 filed on Jun. 18, 2010, the entire contents of which are incorporated herein by reference.

BACKGROUND

1. Field

Embodiments discussed herein relate to an analog-to-digital (A/D) conversion circuit and an A/D conversion method.

2. Description of Related Art

High-speed interface standards for coupling components in a chip, chips on a board, or chips mounted on different boards include, for example, Advanced Technology Attachment (Serial-ATA), Peripheral Component Interconnect (PCI)-Express, Universal Serial Bus (USB) 3.0, and 10-Gbit Ethernet (registered trademark).

A receiver included in a high-speed interface may include an A/D conversion circuit (ADC) having high resolution.

Related art is disclosed in, for example, "An 8-bit 20 MS/s CMOS A/D Converter with 50 mW Power Consumption," S. Hosotani, T. Miki, A. Maeda, and N. Yazawa and "A 7b 450M Sample/s 50 mW CMOS ADC in 0.3 mm$^2$," Koji Sushihara and Akira Matsuzawa, ISSCC 2002/SESSION 10/HIGH-SPEED ADCs/10.3.

SUMMARY

According to one aspect of the embodiments, an analog-to-digital conversion circuit includes: a plurality of comparators to compare an input analog signal and one of a plurality of reference voltages corresponding to each of a plurality of operations which is used in an analog-to-digital conversion; an interpolating comparator to compare the input analog signal and a determination voltage between a first reference voltage and a second reference voltage corresponding to two of the plurality of comparators respectively; a correction value acquisition circuit, provided for the interpolating comparator, to calculate a correction value for correcting a match determination error between the input analog signal and the determination voltage; a correction value application circuit to set the correction value in the interpolating comparator; a test voltage generation circuit to supply the two of the plurality of comparators with a first test voltage corresponding to one of the determination voltages in the plurality of operations; a common voltage generation circuit to supply the two of the plurality of comparators with a second test voltage; and a correction value calculation circuit to calculate respective correction values corresponding to the determination voltages in the plurality of operations based on a match determination error obtained in accordance with an input of the first test voltage and a match determination error obtained in accordance with an input of the second test voltage.

The object and advantages of the invention will be realized and attained at least by the elements, features, and combinations particularly pointed out in the claims.

It is to be understood that both the foregoing general description and the following detailed description are exemplary and explanatory and are not restrictive of the invention, as claimed.

DESCRIPTION OF THE DRAWINGS

FIG. 2 illustrates an exemplary two-operation recycling ADC;

FIG. 9 illustrates an exemplary correction value table;

DESCRIPTION OF EMBODIMENTS

Each of a plurality of comparators in a flash ADC compares a reference voltage and an input voltage, and latches a comparison result. The resolution of the flash ADC is set based on the number of the comparators.

A high-order determining ADC of a two-operation ADC identifies the high-order bit of the A/D conversion result, and a low-order determining ADC of the two-operation ADC identifies the low-order bit of the A/D conversion result.

An interpolating ADC performs the comparison using an intermediate voltage value between reference voltages input to two adjacent comparators of the flash ADC as a determination level. The interpolating ADC performs resistance division on the outputs from the two comparators, thereby improving the resolution of the ADC. Since size ratio of a plurality of latch comparators included in the interpolating ADC are different, the comparison is performed using a plurality of intermediate voltages between the reference voltages input to the two comparators as the determination level.

Upon power-on, the respective intermediate voltages corresponding to the latch comparators of the interpolating ADC are sequentially input, and calibration is performed. The correction values are used in A/D conversion.

Figure 1:
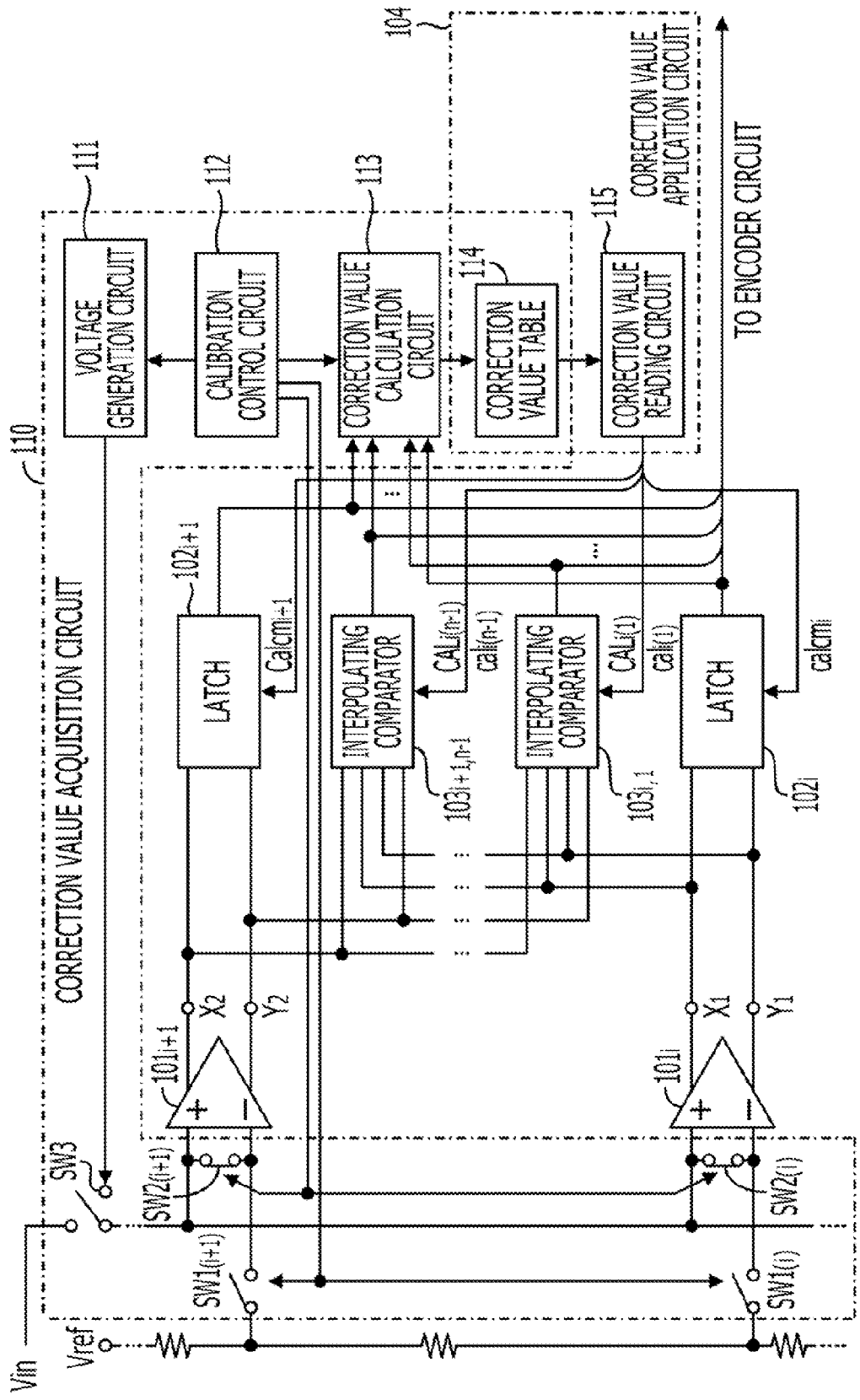
FIG. 1 illustrates an exemplary A/D conversion circuit.

FIG. 1 illustrates an exemplary A/D conversion circuit. The A/D conversion circuit illustrated in FIG. 1 includes an interpolating A/D conversion circuit, a correction value acquisition circuit 110, and a correction value application circuit 104.

The interpolating A/D conversion circuit includes a voltage divider circuit, K number of comparators $101_i$ (i=1 to K), and an interpolating comparator circuit having the determination level set to intermediate voltages between the determination levels of the comparators.

As illustrated in FIG. 1, the voltage divider circuit including a plurality of resistance elements generates K number of reference voltages $Vr_1$ to $Vr_K$ based on a reference voltage Vref. Each of the reference voltages is input to a comparator $101_i$ (i=1 to K) respectively. The comparator $101_i$ compares an input voltage Vin with the reference voltage. Differential outputs X and Y of the comparators $101_i$ and $101_{i+1}$ are input to latches $102_i$ and $102_{i+1}$ respectively, and are latched in synchronization with a certain clock signal. FIG. 1 illustrates the i-th comparator $101_i$, the i+1-th comparator $101_{i+1}$, the latches $102_i$ and $102_{i+1}$, and the interpolating comparator circuit which performs comparison using intermediate voltages between reference voltages $Vr_i$ and $Vr_{i+1}$ as the determination level on the outputs from comparators $101_i$ and $101_{i+1}$. The differential outputs from the i-th comparator $101_i$ are represented as $X_1$ and $Y_1$, and the differential outputs from the i+1-th comparator $101_{i+1}$ are represented as $X_2$ and $Y_2$.

The interpolating comparator circuit illustrated in FIG. 1 include n−1 number of interpolating comparators 103 corresponding to n−1 number of intermediate voltages $Vm_{i,1}$ to $Vm_{i,n-1}$ provided to divide the interval between the reference voltages $Vr_i$ and $Vr_{i+1}$ into the n number of segments. In each of the interpolating comparators 103 illustrated in FIG. 1, the reference numeral "103" is attached with a suffix expressed as the combination of the number i of the lower reference voltage $Vr_i$ and the number j of the interpolating comparator 103 in the interpolating comparator circuit (j=1 to n−1). The interpolating comparators 103 include interpolating comparators $103_{i,1}$ to $103_{i,n-1}$.

The interpolating comparators 103 receive inputs of the differential outputs $X_1$ and $Y_1$ and $X_2$ and $Y_2$ from the two comparators $101_i$ and $101_{i+1}$. Each of the interpolating comparators 103 compares the input voltage Vin with the corresponding intermediate voltage based on the differential outputs. The interpolating comparator 103 includes a latch function, and holds the comparison result in synchronization with a clock signal.

The comparison results held in the latches $102_i$ and $102_{i+1}$ corresponding to the comparators $101_i$ and $101_{i+1}$ and the interpolating comparators $103_{i,1}$ to $103_{i,n-1}$ are supplied to a not-illustrated encoder circuit. The encoder circuit generates a digital signal representing the voltage of the input voltage Vin based on the comparison results.

FIG. 2 illustrates an exemplary two-operation recycling ADC. The two-operation recycling ADC illustrated in FIG. 2 may include an interpolating A/D conversion circuit 100. In FIG. 2, the elements substantially the same as or similar to the elements illustrated in FIG. 1 are designated by the same reference numerals, and description thereof may be omitted or reduced.

A sample-and-hold circuit 105 of the two-operation recycling ADC samples and holds an input analog signal. The sampling result is supplied, as the input voltage Vin, to the interpolating A/D conversion circuit 100 via a switch SW4. The interpolating A/D conversion circuit 100 generates the upper M bits of the A/D conversion result based on, for example, the result of comparison between the sampling result and a reference voltage in a large step size generated from the reference voltage corresponding to the maximum amplitude of the input analog signal. The interpolating A/D conversion circuit 100 includes the K ($K=2^L$) number of comparators. When the interpolating comparator circuit sets, in a first operation, intermediate voltages which are generated by dividing the reference voltage into n ($n=2^m$) number of segments, the data length of the digital output may be the (L+m) bits.

In a second operation, the digital output is input to a digital-to-analog converter (DAC) 106. The DAC 106 generates a voltage corresponding to the upper M bits of the A/D conversion result. An adder 107 adds the voltage and the input voltage Vin to generate a differential voltage Vrd. The switch SW4 opens, and a switch SW5 closes. The differential voltage Vrd is supplied via the switch SW5 to the interpolating A/D conversion circuit 100 in place of the input voltage Vin. The interpolating A/D conversion circuit 100 compares the differential voltage Vrd, in place of the reference voltage of the large operation size, with a reference voltage generated based on the reference voltage corresponding to the resolution of the interpolating A/D conversion circuit 100 in the first operation. The interpolating A/D conversion circuit 100 generates lower M bits of the A/D conversion result based on the comparison result.

In the two-operation recycling ADC, the reference voltage in the first operation and the reference voltage in the second operation are different from each other. Therefore, in the calibration of the interpolating A/D conversion circuit 100, the correction value acquisition circuit 110 may acquire, for each of the interpolating comparators, the correction value suitable for the resolution of the A/D conversion in the first operation or the second operation. The correction value acquired for each of the operations is set in each of the interpolating comparators by the correction value application circuit 104 in accordance with the switching between the operations of the A/D conversion. Therefore, variations in the offset of the interpolating comparators are corrected, and a highly accurate A/D conversion result may be obtained.

The correction value acquisition circuit 110 illustrated in FIG. 1 includes a voltage generation circuit 111, a calibration control circuit 112, a correction value calculation circuit 113, and a correction value table 114. The correction value acquisition circuit 110 includes two switches $SW1_{(i)}$ and $SW2_{(i)}$ corresponding to each of the comparators $101_i$ and another switch SW3. In the correction value application circuit 104, a correction value reading circuit 115 reads the correction values from the correction value table 114 into the interpolating comparators 103.

The voltage generation circuit 111 generates intermediate voltages $Vm_{i,j}$ (i represents one of numbers 1 to K, and j represents one of numbers 1 to n−1) corresponding to the interpolating comparators 103 based on an instruction from the calibration control circuit 112. The voltages and a common voltage $V_{CM}$ generated by the voltage generation circuit 111 are supplied to the comparators $101_i$ via the switch SW3. In a test voltage generation circuit, the voltages generated by the voltage generation circuit 111 based on the instruction from the calibration control circuit 112 are supplied to the comparators $101_i$ via the switch SW3.

The switch $SW1_{(i)}$ provided for each of the comparators $101_i$ cuts off the connection between a reference voltage input terminal of the corresponding comparator $101_i$ and the voltage divider circuit in accordance with a switch changeover signal output from the calibration control circuit 112. The switch $SW2_{(i)}$ short-circuits the reference voltage input terminal and an input voltage input terminal of the corresponding comparator $101_i$ in accordance with a switch changeover signal. After the disconnection of the comparators $101_i$ from the reference voltage, the voltage generation circuit 111 generates the common voltage $V_{CM}$ based on an instruction form the calibration control circuit 112, thereby the common voltage $V_{CM}$ being supplied to the input terminals of each of the comparators $101_i$. The voltage generation circuit 111, the calibration control circuit 112, the switch SW3, and two switches corresponding to each of the comparators $101_i$ may correspond to a common voltage generation circuit.

The correction value calculation circuit 113 collects output signals from the latches 102 corresponding to the comparators 101 and the interpolating comparators 103 based on an instruction from the calibration control circuit 112. The correction value calculation circuit 113 generates digital values representing respective match determination offsets of the latches 102 and the interpolating comparators 103 based on the output signals. The digital values representing the offsets, which is generated by the correction value calculation circuit 113, may be held in the correction value table 114 as the correction values for the latches 102 and the interpolating comparators 103.

The correction value calculation circuit 113 may calculate the match determination offsets by using the method disclosed in Japanese Patent Application No. 2010-73828.

Figures 3A, 3B:
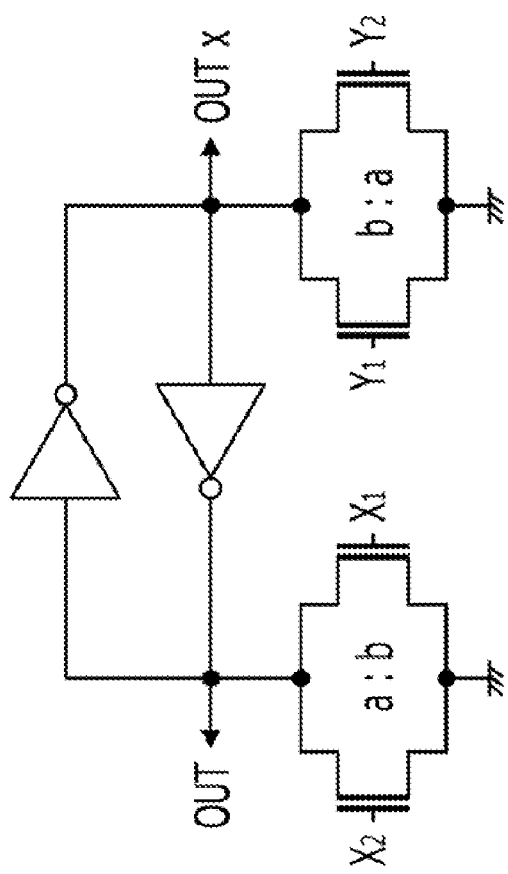
FIGS. 3A and 3B illustrate an exemplary latch comparator.

FIGS. 3A and 3B illustrate an exemplary latch comparator. The latch comparator illustrated in FIG. 3A may be included in the latches 102 and the interpolating comparators 103 illustrated in FIG. 1. FIG. 3B illustrates an exemplary channel width ratio of a latch comparator.

The latch comparator illustrated in FIG. 3A includes two pairs of NMOS (N-channel Metal Oxide Semiconductor) transistors and one pair of inverters. The drain terminals of each of the two NMOS transistors included in each of the pairs are coupled to each other, and the source terminals thereof are coupled to each other. The respective connection points of the source terminals are separately grounded. The inverters forming one pair are provided in the opposite direction from each other, and are coupled in parallel between the connection points of the drain terminals of the two pairs of NMOS transistors. The respective gates of two NMOS transistors included in one of the pairs receive inputs of the outputs $X_1$ and $X_2$ from one of two comparators to be interpolated. The outputs $Y_1$ and $Y_2$ from the other one of the two comparators are input to the respective gates of the NMOS transistors included in the other pair. In the latch comparator, the voltages at the connection points between the drains of the two pairs of NMOS transistors and the inverters are output as differential outputs OUT and OUTx.

In the latch comparator illustrated in FIG. 3A, the outputs $X_1$ and $X_2$ and the outputs $Y_1$ and $Y_2$ from the two comparators are respectively interpolated based on the channel width ratio of two NMOS transistors included in each of the pairs. For example, the channel width ratio a:b in the n−1 number of latch comparators varies in an operation wise manner from 1:n−1 to n−1:1, as illustrated in FIG. 3B. The n−1 number of latch comparators may correspond to the n−1 number of interpolating comparators 103 illustrated in FIG. 1. The circuits having a value "0" in one side of the channel width ratio illustrated in FIG. 3B may correspond to the latches 102 illustrated in FIG. 1. In FIG. 3B, a latch comparator included in the latch $102_i$ corresponding to the comparator $101_i$ illustrated in FIG. 1 is represented by a latch ID (Identifier) "$L_i$." In FIG. 3B, a latch comparator included in the n−1 number of interpolating comparators 103 is represented by a latch ID "$L_{i,j}$" (j=1 to n−1).

Figure 4:
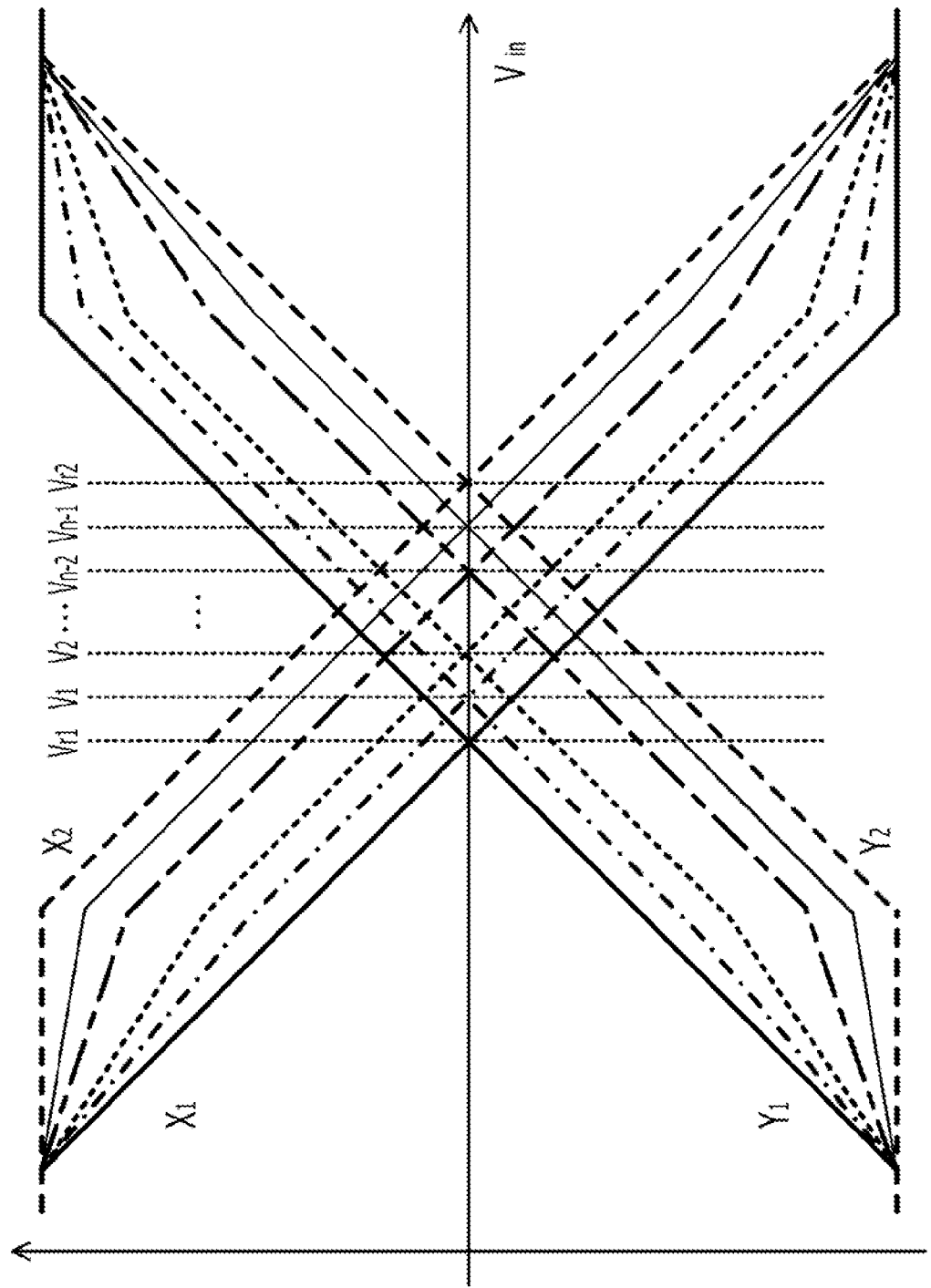
FIG. 4 illustrates an exemplary operation of a latch comparator.

FIG. 4 illustrates an exemplary operation of a latch comparator. Bold solid lines in FIG. 4 indicate the outputs $X_1$ and $Y_1$ from two comparators, which are input to the latch comparator. Bold broken lines in FIG. 4 indicate changes in the outputs $X_2$ and $Y_2$ with respect to the input voltage Vin.

In the latch comparators having a value "0" in one side of the channel width ratio, the inputs $X_1$ and $Y_1$ or the inputs $X_2$ and $Y_2$ may be substantially the same as each other, if, for example, the input voltage Vin is substantially the same as the reference voltage $V_{r1}$ or $V_{r2}$ corresponding to the two comparators. In the latch comparators corresponding to the n−1 number of interpolating comparators 103, if the input voltage Vin is substantially equal to intermediate voltages $V_1$ to $V_{n-1}$ each shifted from the reference voltage by the width corresponding to the channel width ratio, the input voltages X and Y interpolated with the respective ratios may be substantially equal to each other. In FIG. 4, changes in the input voltages X and Y interpolated with the respective ratios are indicated by different types of lines.

The channel width of each of the NMOS transistors included in the latch comparator may not match the design value. Therefore, the input voltage Vin detected in each latch comparator may have an offset from an ideal value.

Figure 5:
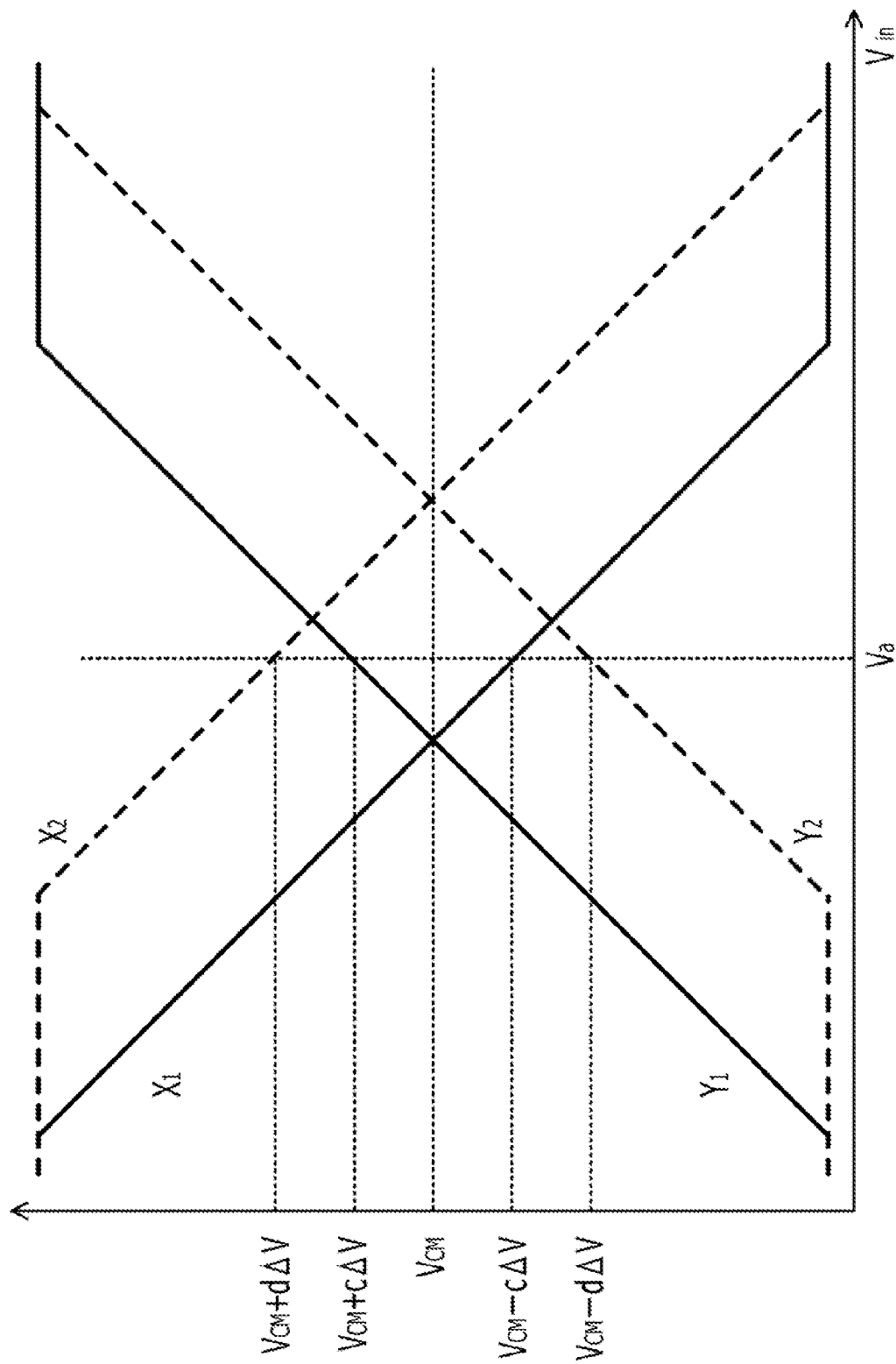
FIG. 5 illustrates an exemplary offset of a latch comparator.
Figure 6:
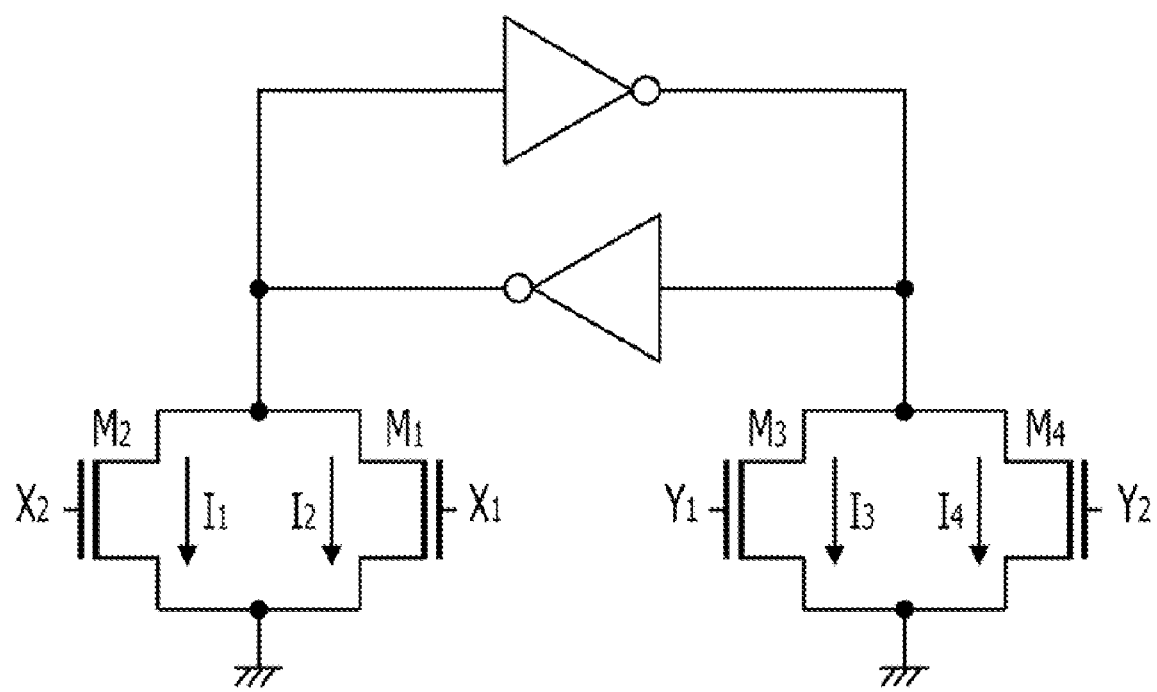
FIG. 6 illustrates an exemplary offset of a latch comparator.

FIG. 5 illustrates an exemplary offset of a latch comparator. FIG. 6 illustrates an exemplary offset of a latch comparator.

In FIG. 5, the voltage $V_{CM}$ represents a voltage when the inputs $X_1$ and $Y_1$ or the inputs $X_2$ and $Y_2$ to the latch comparator are balanced with each other. Input voltages $X_1(Va)$, $X_2(Va)$, $Y_1(Va)$, and $Y_2(Va)$ when the comparator determines as matching an input voltage Va are represented as the formulae (1) to (4) with the voltage $V_{CM}$ and the resolution $\Delta V$ of the interpolating A/D conversion circuit 100.

$$X_1(Va)=V_{CM}-c\Delta V \tag{1}$$

$$X_2(Va)=V_{CM}+d\Delta V \tag{2}$$

$$Y_1(Va)=V_{CM}+c\Delta V \tag{3}$$

$$Y_2(Va)=V_{CM}-d\Delta V \tag{4}$$

As illustrated in FIG. 6, currents $I_1$, $I_2$, $I_3$, and $I_4$ respectively flow through NMOS transistors $M_1$, $M_2$, $M_3$, and $M_4$ of the latch comparator in accordance with inputs of the input voltages $X_1$, $X_2$, $Y_1$, and $Y_2$. The conductance G of an NMOS transistor is represented as the formula (5) with the carrier mobility $\mu_n$, the per-unit gate capacitance $C_{OX}$, the gate width W, the gate length L, the gate-source voltage $V_{GS}$, and the threshold voltage $V_{TH}$.

$$I = \mu_n C_{OX} \frac{W}{L}(V_{GS}-V_{TH}) \times V_{DS} \tag{5}$$

The current I flowing through each transistor is represented as the formula (6) expressed as the product of the above-described conductance G and the drain-source voltage $V_{DS}$.

$$I=GV_{DS} \tag{6}$$

If the equations $\beta=\mu_n C_{OX}W/L$ and $\alpha=\beta \times V_{DS}$ are established, the current I is represented as the formula (7) with the gate-source voltage $V_{GS}$ and the threshold voltage $V_{TH}$.

$$I=\alpha(V_{GS}-V_{TH}) \tag{7}$$

The NMOS transistors $M_1$, $M_2$, $M_3$, and $M_4$ may have substantially the same drain-source voltage $V_{DS}$. The source voltage may be substantially a ground. The respective gate-source voltages $V_{GS}$ corresponding to the NMOS transistors $M_1$, $M_2$, $M_3$, and $M_4$ are represented by the formulae (1) to (4). The channel width ratio of the NMOS transistors $M_1$ and $M_2$ and the channel width ratio of the NMOS transistors $M_3$ and $M_4$ may be b:a. The currents $I_1$, $I_2$, $I_3$, and $I_4$ respectively flowing through the NMOS transistors $M_1$, $M_2$, $M_3$, and $M_4$ are represented as the formulae (8) to (11).

$$I_1=b\alpha\{(V_{CM}-c\Delta V)-V_{TH1}\} \tag{8}$$

$$I_2=a\alpha\{(V_{CM}+d\Delta V)-V_{TH2}\} \tag{9}$$

$$I_3=b\alpha\{(V_{CM}+c\Delta V)-V_{TH3}\} \tag{10}$$

$$I_4=a\alpha\{(V_{CM}-d\Delta V)-V_{TH4}\} \tag{11}$$

In the formulae (8) to (11), $V_{TH1}$ to $V_{TH4}$ represent the respective threshold voltages of the NMOS transistors $M_1$, $M_2$, $M_3$, and $M_4$. In the latch comparator, an offset may occur from the difference between the sum of the currents $I_1$ and $I_2$ ($I_1+I_2$) and the sum of the currents $I_3$ and $I_4$ ($I_3+I_4$). The difference between the currents {($I_1+I_2$)−($I_3+I_4$)} is represented as the formula (12).

$$(I_1+I_2)-(I_3+I_4)=2\alpha(ad-bc)\Delta V - \{b\alpha(V_{TH1}-V_{TH3})+a\alpha(V_{TH2}-V_{TH4})\} \quad (12)$$

If the numerical values ad and be are substantially equal to each other and the threshold voltages have the relationships $V_{TH1}=V_{TH3}$ and $V_{TH2}=V_{TH4}$, the latch comparator may not have an offset. In a semiconductor device, an offset may occur due to, for example, variations in channel width of the NMOS transistor $M_1$, $M_2$, $M_3$, or $M_4$.

The threshold voltages $V_{TH1}$ to $V_{TH4}$ included in the second term of the formula (12) may correspond to respective characteristic values of the NMOS transistors $M_1$, $M_2$, $M_3$, and $M_4$. The value of the second term does not depend on the value of the input voltage Va. The resolution $\Delta V$ of the interpolating A/D conversion circuit 100 included in the first term of the formula (12) depends on the input voltage Va. The value of the first term varies depending on the input voltage Va. For example, if the value of the input voltage is $\frac{1}{2}^m$ when the lower portion of the A/D conversion result is generated, the difference between the currents flowing through the NMOS transistors included in the latch comparator, i.e., {($I_1+I_2$)−($I_3+I_4$)} is represented as the formula (13).

$$(I_1+I_2)-(I_3+I_4)=2\alpha(ad-bc)\Delta V/2^m - \{b\alpha(V_{TH1}-V_{TH3})+a\alpha(V_{TH2}-V_{TH4})\} \quad (13)$$

Figure 7:
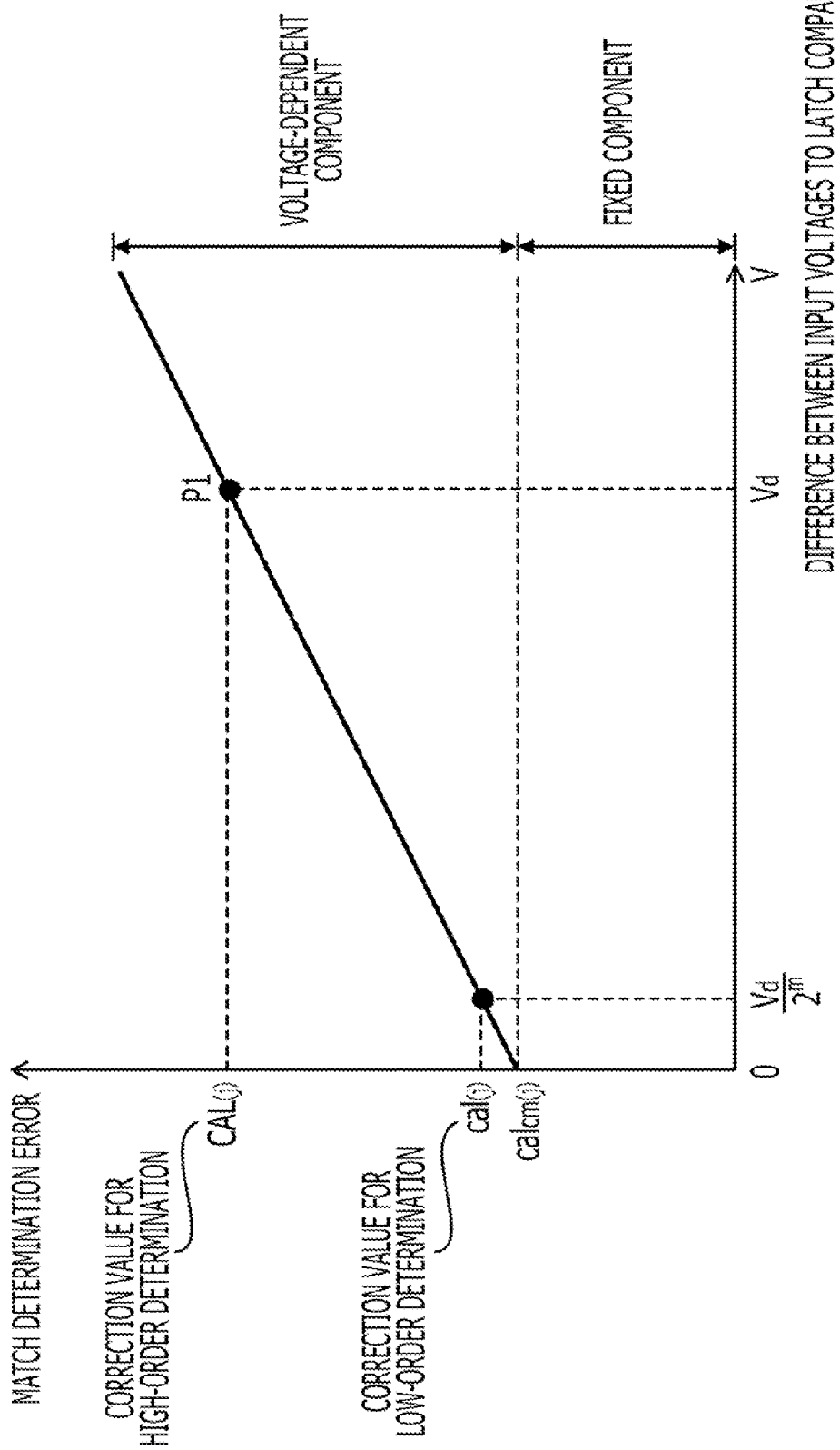
FIG. 7 illustrates an exemplary correction of a latch comparator.

FIG. 7 illustrates an exemplary correction of a latch comparator. The horizontal axis represents the difference between the input voltages to the latch comparator, and the vertical axis represents the match determination error corresponding to the offset.

For example, a point P1 illustrated in FIG. 7 represents an upper conversion correction value CAL(j) applied to a latch comparator j when the upper portion of the A/D conversion result is generated in the first operation of the two-operation A/D conversion. The upper conversion correction value CAL(j) may correspond to a match determination error output from the latch comparator j when an intermediate voltage $Vm_j$, which corresponds to the determination level when the upper portion of the A/D conversion result is generated, is input to each of the comparators 101. A voltage Vd illustrated in FIG. 7 may correspond to the difference between the input voltages to the latch comparator corresponding to the intermediate voltage $Vm_j$.

The upper conversion correction value CAL(j) includes a fixed component independent of the voltage and a voltage-dependent portion. The fixed component included in the match determination error of the latch comparator j may correspond to the output from the latch comparator j output when the difference between the input voltages to the latch comparator j is "0." In FIG. 7, calcm(j) represents the fixed component.

The voltage-dependent component of the offset of the latch comparator, e.g., the voltage-dependent component of the match determination error, is proportional to the resolution $\Delta V$ dependent on the input voltage. Therefore, the value of the voltage-dependent component of the match determination error in the lower determination is calculated based on the voltage-dependent component included in the high-order conversion correction value CAL(j). For example, the voltage-dependent component included in the upper conversion correction value CAL(j) is multiplied by the ratio of the input voltage in the lower determination to the input voltage in the upper determination. The voltage-dependent component of the match determination error in the lower determination is calculated through a simple arithmetic process. The calculated value of the voltage-dependent component and the value of the fixed component are added. Thereby, a correction value cal(j) corresponding to the match determination error in the generation of the lower portion of the A/D conversion result is calculated. In FIG. 7, the ratio of the input voltage in the lower determination to the input voltage in the upper determination may be $\frac{1}{2}^m$.

In a similar manner, the correction value of the latch comparator used when A/D-converting the input analog signal through three or more operations is calculated for each of the operations of the A/D conversion.

Figure 8:
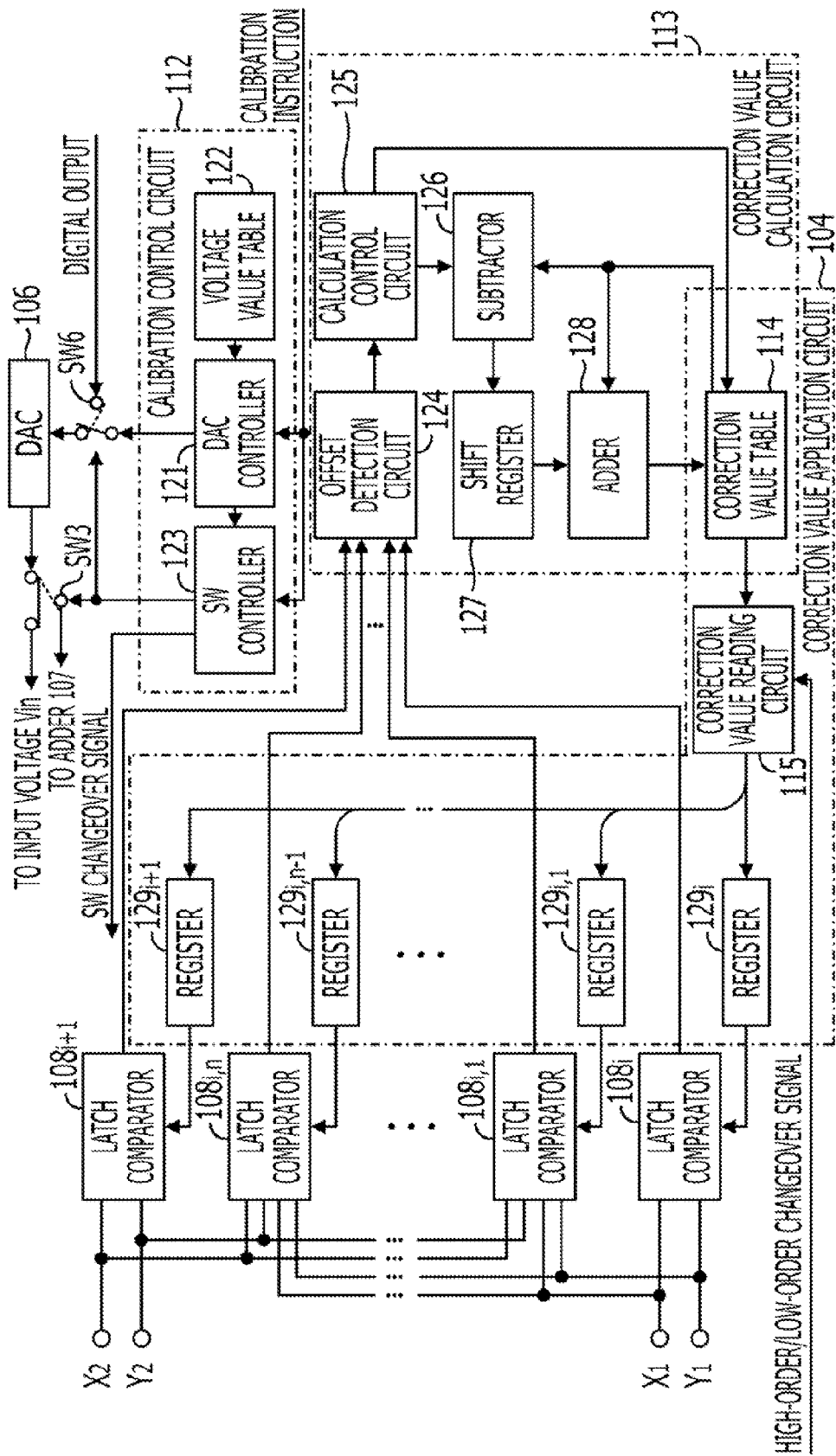
FIG. 8 illustrates an exemplary correction value calculation circuit.

FIG. 8 illustrates an exemplary correction value calculation circuit. In FIG. 8, the elements which are substantially the same as or similar to the elements illustrated in FIG. 1 or 2 are designated by the same reference numerals, and description thereof may be omitted or reduced.

Latch comparators $108_i$ and $108_{i+1}$ illustrated in FIG. 8 may respectively correspond to the latches $102_i$ and $102_{i+1}$ illustrated in FIG. 1. The n−1 number of latch comparators $108_{i,j}$ (j=1 to n−1) interposed between the two latch comparators $108_i$ and $108_{i+1}$ may correspond to the interpolating comparators $103_{i,j}$ (j=1 to n−1) illustrated in FIG. 1. Registers $129_i$ and $129_{i+1}$ and registers $129_{i,j}$ (j=1 to n−1) are respectively provided for the latch comparators $108_i$ and $108_{i+1}$ and the latch comparators $108_{i,j}$. FIG. 8 illustrates elements corresponding to the i-th comparator $101_i$ and the i+1-th comparator $101_{i+1}$ of the interpolating A/D conversion circuit 100.

The registers 129 hold the correction values read from the correction value table 114 by the correction value reading circuit 115. Each of the latch comparators $108_i$ and $108_{i+1}$ and the latch comparators $108_{i,j}$ includes an offset correction circuit for correcting the offset based on the correction value held in the corresponding register 129. The circuit described in Japanese Patent Application No. 2010-73828 may be used as the offset correction circuit included in each of the latch comparators 108.

The calibration control circuit 112 illustrated in FIG. 8 includes a DAC controller 121, a voltage value table 122, and a switch (SW) controller 123. The DAC controller 121 reads from the voltage value table 122 the voltage code, which represents the match determination voltage of the latch comparator 108 in each of the operations of the A/D conversion, based on a calibration instruction, and supplies the voltage code to the DAC 106 via a switch SW6. In the two-operation recycling ADC illustrated in FIG. 2, the DAC 106 may be a DAC which generates the voltage corresponding to the upper portion of the A/D conversion result when the low-order portion of the A/D conversion result is generated.

The switch controller 123 controls the switch SW6 based on the input of the calibration instruction such that the voltage code from the DAC controller 121 instead of the digital output from the interpolating A/D conversion circuit 100 is input to the DAC 106. The switch controller 123 controls the switch SW3 such that the output from the DAC 106 is input to the interpolating A/D conversion circuit 100 instead to the adder 107 illustrated in FIG. 2 as the input voltage Vin.

The correction value calculation circuit 113 illustrated in FIG. 8 includes an offset detection circuit 124, a calculation control circuit 125, a subtractor 126, a shift register 127, an adder 128, and the correction value table 114.

The offset detection circuit 124 collects the outputs from the latch comparators 108 included in the interpolating A/D conversion circuit 100. The offset detection circuit 124 detects the respective offsets of the latch comparators 108 based on the collected outputs, and digital values representing the detected offsets are generated. The circuit described in Japanese Patent Application No. 2010-73828 may be used as the offset detection circuit 124.

The calculation control circuit 125 calculates the correction values for the respective operations of the A/D conversion based on the digital values representing the offsets. The subtractor 126, the shift register 127, and the adder 128 may calculate the correction values. The calculated correction values may be held in the correction value table 114.

FIG. 9 illustrates an exemplary correction value table. In FIG. 9, a latch ID "L(i)" represents a latch comparator 108 using, as the match determination voltage, a reference voltage $V_i$ (i represents one of numbers=1 to K) generated by the voltage divider circuit. A latch ID "L(i, j)," which includes the combination of the number representing the lower reference voltage and the number representing an intermediate voltage in the interval indicated by the reference voltage, represents a latch comparator 108 using, as the match determination voltage, an intermediate voltage between two reference voltages $V_i$ and $V_{i+1}$.

The upper conversion correction value CAL, the lower conversion correction value cal, and the characteristic correction value calcm corresponding to the latch comparator 108 which interpolates are attached with a suffix expressed as the combination of the number of the reference voltage and the number of the intermediate voltage in the interval indicated by the reference voltage. The latch comparator 108 corresponding to the reference voltage may obtain the characteristic correction value calcm.

The latch comparators 108 included in the interpolating A/D conversion circuit 100 may perform calibration upon, for example, power-on of a high-speed interface including an A/D conversion device.

Figure 10:
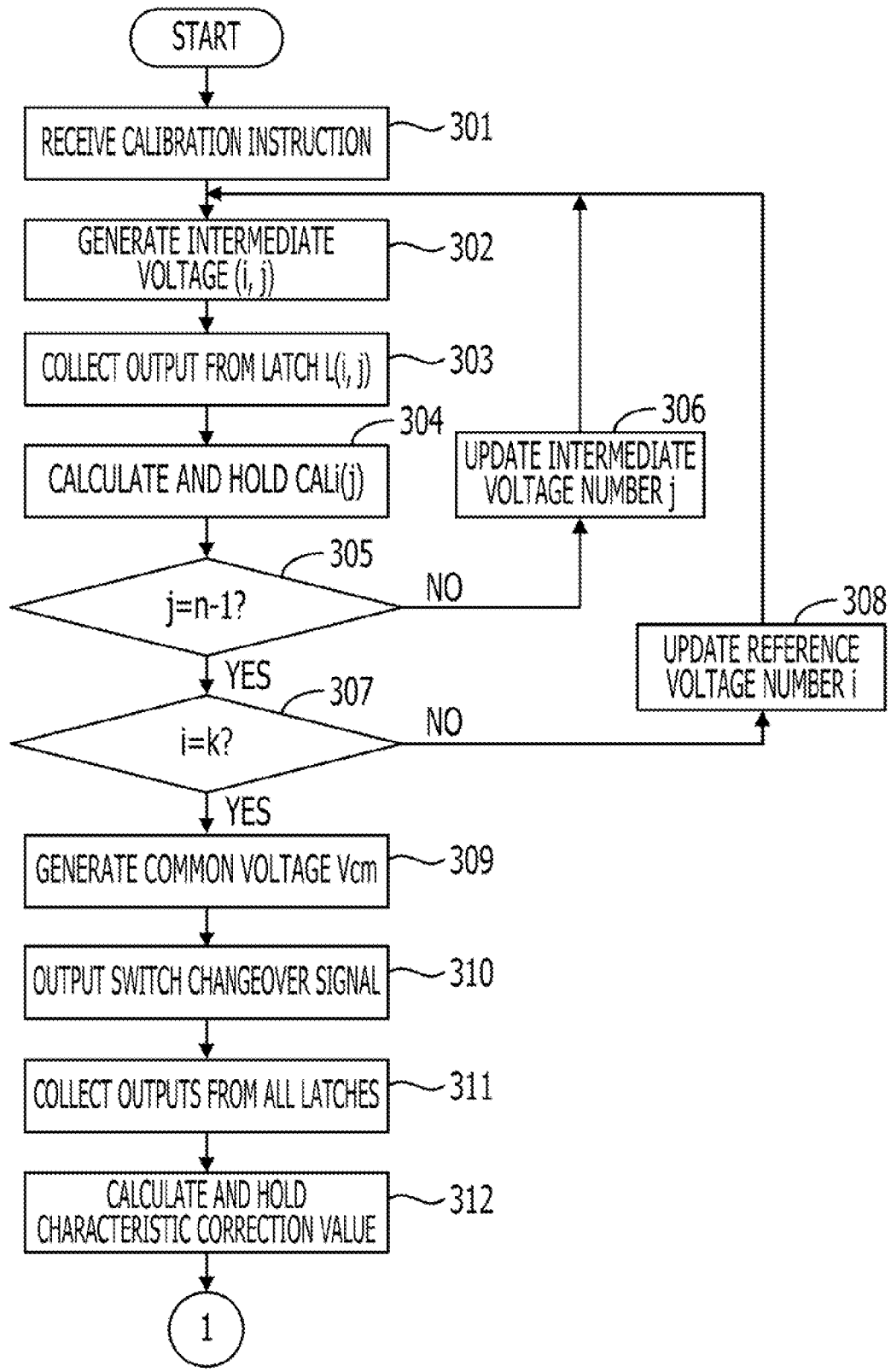
FIG. 10 illustrates an exemplary calibration process.
Figure 11:
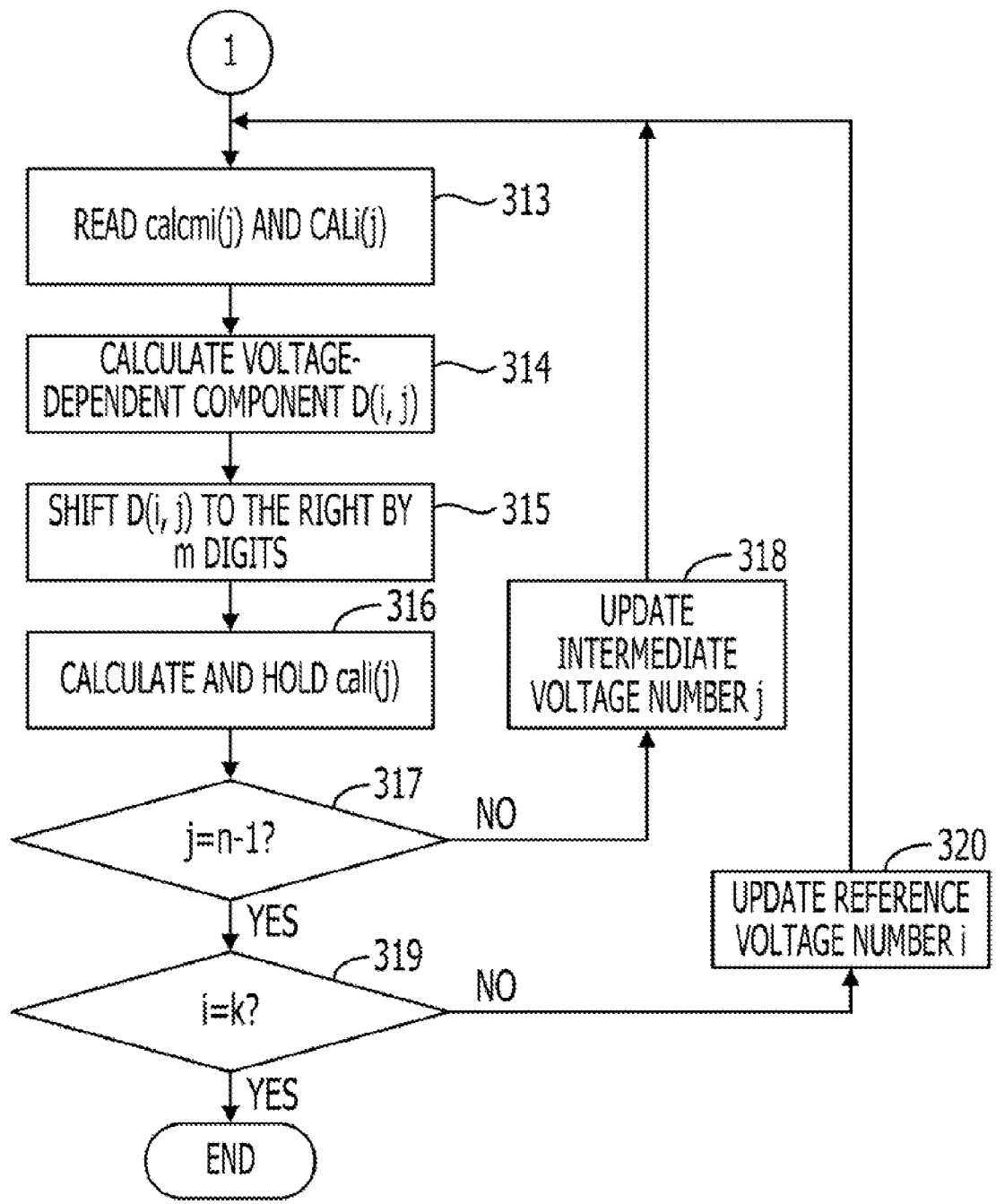
FIG. 11 illustrates an exemplary calibration process.

FIG. 10 illustrates an exemplary calibration process. FIG. 11 illustrates an exemplary calibration process.

In an operation 301, the controller or the like of a receiver supplies a calibration instruction to the calibration control circuit 112 in accordance with, for example, the power-on of a high-speed interface. The DAC controller 121 illustrated in FIG. 8 supplies the DAC 106 with the voltage code held in the voltage value table 122 in association with the combination of the reference voltage number i and the intermediate voltage number j. The voltage value table 122 may hold, for example, the voltage code representing the intermediate voltage for generating the upper portion of the A/D conversion result.

In an operation 302, the DAC 106 generates an intermediate voltage (i, j) in accordance with the voltage code, and supplies the intermediate voltage (i, j) to the interpolating A/D conversion circuit 100 as the input voltage Vin.

In an operation 303, the offset detection circuit 124 collects the output from the latch comparator $108_{i,j}$ corresponding to the intermediate voltage (i, j). In FIG. 9, the latch ID L(i, j) represents the latch comparator $108_{i,j}$. In an operation 304, the offset value generated by the offset detection circuit 124 based on the output collected in the operation 303 is held in the correction value table 114 via the calculation control circuit 125 as the upper conversion correction value CALi(j).

In an operation 305, if the intermediate voltage number j is smaller than the number (n−1) of the intermediate voltages, the process returns to the operation 302 after the intermediate voltage number j is updated in an operation 306. Then, the correction value of the latch comparator 108 corresponding to the new intermediate voltage number j is set.

The operations 302 to 306 are repeated. If the upper conversion correction values CALi(j) of the latch comparators 108 corresponding to the intermediate voltages in the interval corresponding to the reference voltage number i is obtained, the process proceeds from the operation 305 to an operation 307.

In the operation 307, if the reference voltage number i is smaller than the total number K of the reference voltages, the process returns to the operation 302 after the reference voltage number i is updated in an operation 308. Then, the correction value of the latch comparator 108 corresponding to the new reference voltage number i is set.

The operations 302 to 308 are repeated. If the high-order conversion correction values CALi(j) of the latch comparators 108 performing interpolation is obtained, the process proceeds from the operation 307 to an operation 309.

In the operation 309, the DAC controller 121 supplies the DAC 106 with the voltage code representing a common voltage Vcm, and the DAC 106 generates the common voltage Vcm. The common voltage Vcm may be, for example, a voltage included in the range in which the operation of the comparators 101 is guaranteed.

In an operation 310 as well as the operation 309, the switch controller 123 outputs a switch changeover signal to, for example, the switches SW1(i) and SW2(i) (i=1 to K) provided for each of the comparators $101_i$ (i=1 to K) illustrated in FIG. 1. The switches SW1(i) and SW2(i) short-circuit the input terminals of the comparator $101_i$ based on the switch changeover signal, and supply the common voltage Vcm to the input terminals.

The offset detection circuit 124 collects the output from each of the latch comparators 108 in an operation 311. The offset value corresponding to the common voltage value generated based on the collected output is held in the correction value table 114 as the characteristic correction value of the latch comparator 108 in an operation 312.

After the initialization of the reference voltage number i and the intermediate voltage number j by the calculation control circuit 125, the process proceeds to an operation 313. The calculation control circuit 125 reads from the correction value table 114 the upper conversion correction value CALi (j) and the characteristic correction value calcmi(j) of the latch comparator $108_{i,j}$ corresponding to the reference voltage number i and the intermediate voltage number j in an operation 313.

The read upper conversion correction value CALi(j) and characteristic correction value calcmi(j) are supplied to the subtractor 126. In an operation 314, the characteristic correction value calcmi(j) is subtracted from the upper conversion correction value CALi(j) to calculate a voltage-dependent component D(i, j). In an operation 315, the shift register 127 shifts the voltage-dependent component D(i, j) to the right by m digits. As illustrated in FIG. 9, the intermediate voltage corresponding to the latch comparator 108 performing interpolation may be one of the voltages which divide the interval between two reference voltages into the $2^m$ number of segments. Due to the shift, therefore, the voltage-dependent component D(i, j) is multiplied by the ratio of the input voltage in the lower determination to the input voltage in the upper determination.

The shift result of the shift register 127 and the characteristic correction value calcmi(j) are added by the adder 128, and the lower conversion correction value cali(j) is output. In an operation 316, the lower conversion correction value cali (j) may be held in the correction value table 114.

In an operation 317, if the intermediate voltage number j is smaller than the number (n−1) of the intermediate voltages included in the interval, the process proceeds to an operation 318, and the intermediate voltage number j is updated. The process then returns to the operation 313, and the lower conversion correction value of the latch comparator 108 corresponding to the new intermediate voltage number j is calculated.

The operations 313 to 318 are repeated. If the low-order conversion correction values cali(j) of the latch comparators 108 corresponding to all of the intermediate voltages included in the interval corresponding to the reference voltage number i are calculated, the process proceeds from the operation 317 to an operation 319.

In the operation 319, if the reference voltage number i is smaller than the total number K of the reference voltages, the process proceeds to an operation 320 to update the reference voltage number i. The process returns to the operation 313, and the lower conversion correction value of the latch comparator 108 corresponding to the new reference voltage number i is calculated.

The operations 313 to 320 are repeated. If the low-order conversion correction values cali(j) of all of the latch comparators 108 performing interpolation are calculated, the calibration process is completed in the operation 319.

In the latch comparator performing interpolation, the lower conversion correction value is calculated based on the upper conversion correction value obtained based on the input of the intermediate voltage in the upper conversion and the characteristic correction value obtained based on the input of the common voltage. For example, the correction value acquisition circuit 110 including the correction value calculation circuit 113 illustrated in FIG. 1 or 8 may not include an upper-bit DAC which generates the intermediate voltage for the lower conversion for acquiring the lower conversion correction value. Accordingly, the circuit size may be reduced, and the latch comparators 108 included in the interpolating A/D conversion circuit 100 may be calibrated with high accuracy.

The intermediate voltage for the upper conversion corresponding to the latch comparator and the above-described common voltage may be generated by the DAC 106 which generates the lower portion of the A/D conversion result in the two-operation recycling ADC. As illustrated in FIG. 8, the DAC 106 for generating the differential voltage for the lower conversion may generate the intermediate voltage and the common voltage for the calibration process.

Figure 12:
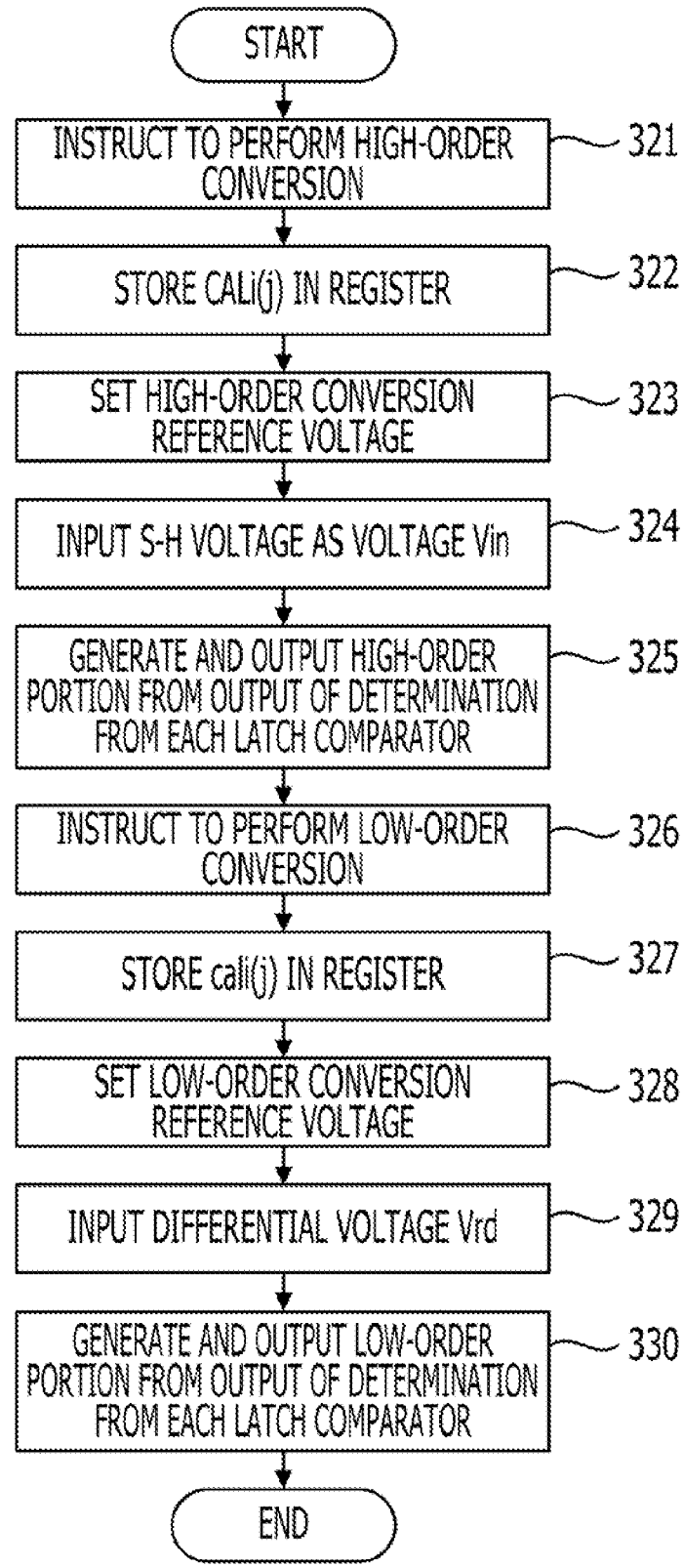
FIG. 12 illustrates an exemplary conversion.

With the use of the upper conversion correction value and the lower conversion correction value, the two-operation recycling ADC performs the A/D conversion on the input analog signal. FIG. 12 illustrates an exemplary A/D conversion.

In an operation 321, the two-operation recycling ADC operates in accordance with an upper conversion instruction for instructing the ADC to generate the upper portion of the A/D conversion result of the input analog signal. In an operation 322, the correction value reading circuit 115 reads from the correction value table 114 the upper conversion correction value CALi(j) corresponding to the latch comparator $108_{i,j}$ performing interpolation, and stores the upper conversion correction value CALi(j) in the corresponding register $129_{i,j}$. The register $129_i$ corresponding to the latch comparator $108_i$ corresponding to the reference voltage may store the corresponding characteristic correction value calcmi.

In an operation 323, an upper conversion reference voltage is set. In an operation 324, a sample-and-hold (S-H) voltage sampled by the sample-and-hold circuit 105 is input to the interpolating A/D conversion circuit 100 as the input voltage Vin.

In the latch comparator $108_{i,j}$ performing interpolation, the offset correction is performed based on the upper conversion correction value CALi(j) held in the register $129_{i,j}$. In the latch comparator $108_i$ corresponding to the reference voltage, the offset correction is performed based on the characteristic correction value calcmi held in the register $129_i$. Each of the latch comparators 108 outputs the determination result of comparison between the upper conversion determination level and the input voltage Vin. The encoder circuit of the interpolating A/D conversion circuit 100 generates the upper portion of the A/D conversion result corresponding to the input voltage Vin based on the determination output from each of the latch comparators 108 included in the interpolating A/D conversion circuit 100. In an operation 325, the upper portion of the A/D conversion result is output to the outside and supplied to the DAC 106 illustrated in FIG. 2.

In an operation 326, in accordance with a low-order conversion instruction, the lower portion of the A/D conversion result of the input analog signal is generated. In an operation 327, in accordance with the low-order conversion instruction, the correction value reading circuit 115 reads from the correction value table 114 the lower conversion correction value cali(j) corresponding to the latch comparator $108_{i,j}$ performing interpolation, and stores the lower conversion correction value cali(j) in the corresponding register $129_{i,j}$.

In an operation 328, a lower conversion reference voltage is set. The DAC 106 generates the voltage corresponding to the upper portion of the A/D conversion result. The adder 107 generates the differential voltage Vrd between the sample-and-hold (S-H) voltage and the output from the DAC 106, and switching is performed between the switches SW4 and SW5 illustrated in FIG. 2. In an operation 329, the differential voltage Vrd, in place of the sample-and-hold voltage, is input to the interpolating A/D conversion circuit 100 as the input voltage Vin.

In the latch comparator $108_{i,j}$ performing interpolation, the offset correction is performed based on the lower conversion correction value cali(j) held in the register $129_{i,j}$. In the latch comparator $108_i$ corresponding to the reference voltage, the offset correction is performed based on the characteristic correction value calcmi held in the register $129_i$. Each of the latch comparators 108 outputs the determination result of comparison between the lower conversion determination level and the differential voltage Vrd. The encoder circuit of the interpolating A/D conversion circuit 100 generates the A/D conversion result corresponding to the differential voltage Vrd based on the output of the determination from each of the latch comparators 108 included in the interpolating A/D conversion circuit 100. In an operation 330, the A/D conversion result is output to the outside as the lower portion of the A/D conversion result corresponding to the analog input voltage Vin. Thereby, the A/D conversion is completed.

In the latch comparator 108, the upper conversion correction value CALi(j) and the lower conversion correction value cali(j) are alternatively set and the offset correction is performed. The above-described processes may be repeated, the correction values set in three or more operations, and the A/D conversion is performed.

Figure 13:
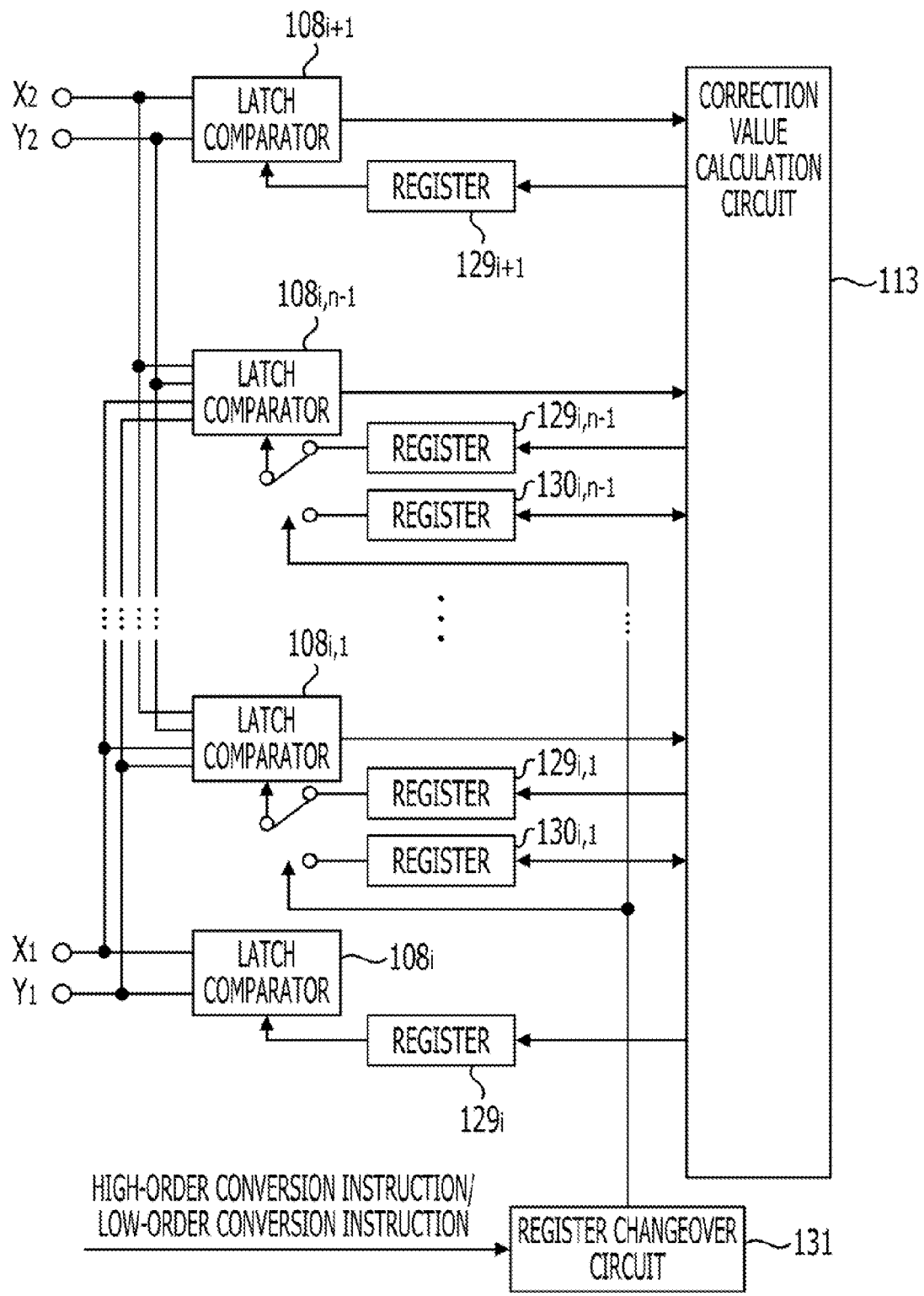
FIG. 13 illustrates an exemplary correction value application circuit.

Switching may be performed between the register for the upper conversion correction value and the register for the lower conversion correction value provided for the latch comparator 108. FIG. 13 illustrates an exemplary correction value application circuit. In FIG. 13, the elements substantially the same as or similar to the elements illustrated in FIG. 8 are designated by the same reference numerals, and description thereof may be omitted or reduced.

In FIG. 13, a register $129_{i,j}$, a register $130_{i,j}$, and a changeover switch are provided for each of the latch comparators $108_{i,j}$ performing interpolation. The correction values calculated by the correction value calculation circuit 113 may be written not into the correction value table 114 but into the registers 129 and 130.

For example, when the upper conversion correction value CALi(j) corresponding to the latch comparator $108_{i,j}$ performing interpolation is calculated, the correction value calculation circuit 113 may write the upper conversion correction value CALi(j) into the corresponding register $130_{i,j}$. When the characteristic correction value corresponding to the latch comparator 108 is acquired in accordance with the input of the common voltage, the correction value calculation circuit 113 may calculate the lower conversion correction value cali(j) with reference to the upper conversion correction value CALi(j) held in the register 130. The calculated lower conversion correction value cali(j) is held in the register 129 corresponding to the latch comparator 108.

In accordance with the upper conversion instruction, a register changeover circuit 131 illustrated in FIG. 13 instructs the changeover switch corresponding to the latch comparator $108_{i,j}$ performing interpolation to select the register $130_{i,j}$ holding the upper conversion correction value CALi(j). In accordance with the lower conversion instruction, the register changeover circuit 131 controls the changeover switch to select the register $129_{i,j}$ holding the lower conversion correction value cali(j), and the correction value corresponding to the latch comparator $108_{i,j}$ is set.

All examples and conditional language recited herein are intended for pedagogical objects to aid the reader in understanding the invention and the concepts contributed by the inventor to furthering the art, and are to be construed as being without limitation to such specifically recited examples and conditions. Although the embodiment(s) of the present inventions have been described in detail, it should be understood that the various changes, substitutions, and alterations could be made hereto without departing from the spirit and scope of the invention.

What is claimed is:

1. An analog-to-digital conversion circuit comprising:
    a plurality of comparators to compare an input analog signal and one of a plurality of reference voltages corresponding to each of a plurality of operations which is used in an analog-to-digital conversion;
    an interpolating comparator to compare the input analog signal and a determination voltage between a first reference voltage and a second reference voltage corresponding to two of the plurality of comparators respectively;
    a correction value acquisition circuit to calculate a correction value for correcting a match determination error between the input analog signal and the determination voltage;
    a correction value application circuit to set the correction value in the interpolating comparator;
    a test voltage generation circuit to supply the two of the plurality of comparators with a first test voltage corresponding to one of the determination voltages in the plurality of operations;
    a common voltage generation circuit to supply the two of the plurality of comparators with a second test voltage; and
    a correction value calculation circuit to calculate respective correction values corresponding to the determination voltages in the plurality of operations based on a match determination error obtained in accordance with an input of the first test voltage and a match determination error obtained in accordance with an input of the second test voltage.

2. The analog-to-digital conversion circuit according to claim 1, wherein the determination voltage is at least one of a plurality of divided voltages between the first reference voltage and the second reference voltage.

3. The analog-to-digital conversion circuit according to claim 1, wherein the common voltage generation circuit supplies the two of the plurality of comparators with the second test voltage in place of the input analog signal, the first reference voltage, and the second reference voltage.

4. The analog-to-digital conversion circuit according to claim 1, wherein the test voltage generation circuit generates the determination voltage in a one of the plurality of operations as the first test voltage.

5. The analog-to-digital conversion circuit according to claim 4, wherein the one of the plurality of operations correspond to an operation in which the plurality of reference voltages are set with a largest operation size.

6. The analog-to-digital conversion circuit according to claim 1, wherein the common voltage generation circuit includes a switch to disconnect the plurality of comparators from the corresponding reference voltages and couple the comparators to the input analog signal, and
    wherein the second test voltage is supplied to each of the comparators in place of the input analog signal.

7. The analog-to-digital conversion circuit according to claim 1, wherein the correction value calculation circuit includes
    a component identification circuit to, based on the match determination error obtained in accordance with an input of the first test voltage and corresponding to the determination voltage and the match determination error obtained in accordance with an input of the second test voltage, determine a first component not dependent on an input voltage included in the match determination errors and a second component dependent on the input voltage, and
    a dependent component calculation circuit to multiply a coefficient corresponding to a ratio between the determination voltage and the first test voltage by a third component corresponding to the first test voltage, and calculate a fourth component of the correction value corresponding to the determination voltage.

8. The analog-to-digital conversion circuit according to claim 7, wherein a sum of the first component and the fourth component is calculated as the correction value.

9. The analog-to-digital conversion circuit according to claim 7, wherein the component identification circuit generates respective digital values corresponding to the first component and the third component, and
    wherein the dependent component calculation circuit includes a shift register to perform a shift operation on the digital value corresponding to the third component, and generate a digital value corresponding to the second component.

10. The analog-to-digital conversion circuit according to claim 1, wherein the interpolating comparator is provided for each of the $2^m-1$ number of intermediate voltages provided to divide the interval between the first reference voltage and the second reference voltage into the $2^m$ number of segments.

11. An analog-to-digital conversion method comprising:
    comparing an input analog signal and one of a plurality of reference voltages in each of a plurality of operations which is used in an analog-to-digital conversion;
    comparing the input analog signal and a determination voltage between a first reference voltage and a second reference voltage corresponding to the comparison result;
calculating a correction value to correct a match determination error between the input analog signal and the determination voltage;
setting the correction value in a conversion process of the input analog signal in each of the plurality of operations;
setting a first test voltage corresponding to one of the determination voltages in the plurality of operations in place of the input analog signal to be compared with the determination voltage;
setting a second test voltage in place of one of the plurality of reference voltages to be compared and the input analog signal; and
calculating respective correction values corresponding to the determination voltages in the plurality of operations based on the first test voltage serving as the input analog signal and a comparison result between the determination voltage obtained in response to a input of the first test voltage and the second test voltage.

* * * * *